United States Patent [19]

Makabe et al.

[11] 4,364,006
[45] Dec. 14, 1982

[54] REFERENCE VOLTAGE GENERATOR FOR USE IN AN A/D OR D/A CONVERTER

[75] Inventors: Takayoshi Makabe; Yoshiaki Kuraishi, both of Tokyo, Japan

[73] Assignee: Nippon Electric Co., Ltd., Tokyo, Japan

[21] Appl. No.: 241,503

[22] Filed: Mar. 9, 1981

[30] Foreign Application Priority Data

Mar. 21, 1980 [JP] Japan .................................. 55-36474

[51] Int. Cl.³ .............................................. G05F 3/08
[52] U.S. Cl. .................................. 323/353; 338/195; 340/347 CC
[58] Field of Search ............................. 323/352–354, 323/233; 340/347 CC; 338/92, 195; 29/620

[56] References Cited

U.S. PATENT DOCUMENTS

| | | | |
|---|---|---|---|
| 3,930,304 | 1/1976 | Keller et al. | 338/195 |
| 4,016,483 | 4/1977 | Rudin | 323/354 |
| 4,055,773 | 10/1977 | Schoeff | 307/229 |
| 4,150,366 | 4/1979 | Price | 338/195 |
| 4,201,970 | 5/1980 | Onyshkevych | 338/195 |

OTHER PUBLICATIONS

A Single Chip All-MOS 8-Bit A/D Converter by Adib R. Hamade, IEEE Journal of Solid State Circuits, vol. SC-13, No. 6, Dec. 1978.
First Monolithic PCM Filter Cuts Cost of Telecomm Systems, Electronic Design 8, Apr. 12, 1979.
Session III: Compatible Analog and Digital Technology, WAM 3.5: An NMOS Voltage Reference by Robert Blauschild, Patrick Tucci, Richard Muller & Robert Meyer; 1978 IEEE International Solid-State Circuits Conference.

*Primary Examiner*—William H. Beha, Jr.
*Attorney, Agent, or Firm*—Laff, Whitesel, Conte & Saret

[57] ABSTRACT

A simplified, small-sized RV generator has a power source with a voltage adjusting circuit. The adjusting circuit includes a plurality of polysilicon resistors connected serially with polysilicon fuses connected in parallel with and to both ends of each of the resistors. A resistor network is connected to the voltage adjusting circuit and composed of a plurality of polysilicon resistors for providing a reference voltage, based on the output voltage of the adjusting circuit.

2 Claims, 1 Drawing Figure

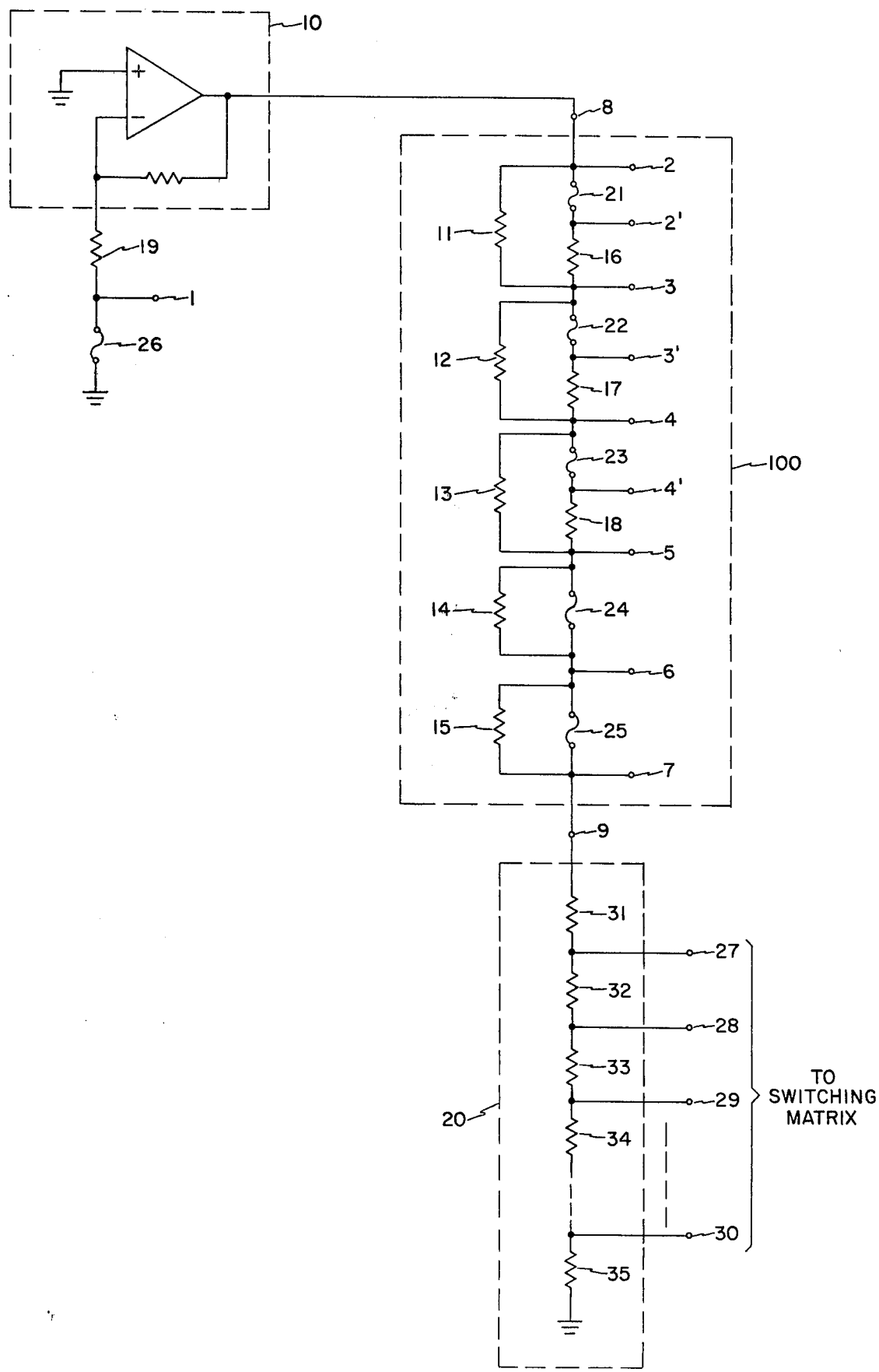

REFERENCE VOLTAGE GENERATOR FOR USE IN AN A/D OR D/A CONVERTER

The present invention relates to a reference voltage generator (hereunder referred to as an "RV generator") for use in an analog to digital (A/D) or a digital to analog (D/A) converter.

Such converters are indispensable to both the conversion of analog speech signals into PCM signals and the reconversion of the PCM signals into the original analog signals. These converters are used in a telephone or a like system based on PCM (pulse code modulation).

In such an A/D converter, an input analog signal is compared with a plurality of reference voltages given from an RV generator having a resistor network weighted stepwise, as $2^0, 2^1, \ldots 2^n$. In a D/A converter, on the other hand, a similar RV generator is installed to generate voltages corresponding to each bit of an input digital codeword signal. A typical example of such an RV generator for use in an A/D converter is described in a paper entitled "A Single Chip ALL-MOS 8-Bit A/D Converter" by Adib R. Hamade, IEEE Journal of Solid State Circuit, Vol. Sc-13, No. 6, December issue, 1978, pp. 785–791 (Reference 1).

In addition, one application of such a D/A converter is found in the U.S. Pat. No. 4,055,773 issued May 23, 1977 (Reference 2). Each RV generator shown in FIGS. 1 and 3 of References 1 and 2 comprises a power source. A resistor network is connected to the source and weighted stepwise for the generation of the reference voltages. In such a generator, however, a voltage given from the source to the network is not constant due to manufacturing deviations of the power source. As a result, to maintain a constant voltage from the power source, a voltage adjusting circuit must be additionally installed between the network and the power source. This voltage adjusting circuit is generally the type shown in FIG. 1 of a paper entitled "First monolithic PCM filter cuts cost of the telecomm systems", Electronic Design, No. 8, April 12 issue, 1979 (Reference 3). More specifically, the adjusting circuit shown in Reference 3 comprises a resistor network having diffused resistors, a switching matrix composed of MOS (metal oxide semiconductor) transistors, and a polysilicon fuse array. To improve the accuracy of the power voltage adjustment, however, the whole structure of this circuit tends to become complicated due to a great increase of the structural elements used. Consequently, the RV generator becomes bulky, as a whole.

One object of the present invention is, therefore, to provide a simplified, small-sized RV generator free from the above-mentioned disadvantages.

According to one aspect of the present invention, an RV generator, has:
a power source for generating a voltage and
a voltage adjusting circuit connected to the power source. There are N (N: being a plural number) polysilicon resistors connected serially and N polysilicon fuses connected in parallel to both ends of each of the N resistors, to adjust the output voltage of the power source.

A resistor network connected to the voltage adjusting circuit and composed of M (M being a plural number) polysilicon resistors for providing (M-1) reference voltages based on the output voltage of the adjusting circuit.

As will become more apparent, a feature of this invention is that it provides incremental resistance elements which are selectively removed from the circuit by an elimination of fuses. However, the invention accomplishes the removal by selectively burning out appropriate fuses.

The present invention will now be described in further detail in conjunction with the attached drawing which illustrates a circuit diagram of the present invention as applied to an A/D converter.

In the drawing, one embodiment of the present invention comprises a reference power source 10 for generating a voltage. A voltage adjusting circuit 100 is connected to the power source 10 and composed of polysilicon resistors 11 to 15 which are connected serially. Polysilicon fuses 21 to 25 are connected in parallel to both ends of each of the resistors 11 to 15 to adjust the output voltage of the power source 10. A resistor network 20 is connected to the voltage adjusting circuit 100 and composed of polysilicon resistors 31 to 35 for providing four reference voltages, based on the output voltage of the circuit 100. The values of the resistors 11 to 15 are selected at $r_1$ to $r_5$, respectively, to have the relationship of $r_1 < r_2 < r_3 < r_4 < r_5$.

The power source 10 may be the one disclosed in a paper entitled "An NMOS Voltage Reference" by Robert A. Blauschild et al., 1978 IEEE International Solid-State Circuits Conference Digest of Technical Papers, session III, WAM 3.5, pp. 50–51, presented at ISSCC held in the United States on Feb. 15, 1978 (Reference 4). Also, the network 20 may be the one illustrated in FIG. 1 of Reference 1. In this case, output terminals 27 to 30 of the network 20 must be connected to the switching matrix shown in FIG. 1 of Reference 1.

To terminals 2 to 7 and 2' to 4' of the circuit 100, are given current pulses of some amplitude to cut off the fuses 21 to 25. The resistors 16 to 18 have the values $r_1'$ to $r_3'$ and are used to prevent the resistors 11 to 13 of the comparatively small values $r_1$ to $r_3$ from being destroyed by the current pulses for cutting off the fuses 21 to 23. However, such additional resistors are not needed for the resistors 14 and 15 which have the comparatively large values $r_4$ and $r_5$ and can endure the application of such current pulses.

The values $r_1$ to $r_5$ and $r_1'$ to $r_3'$ of the resistors 11 to 15 and 16 to 18 are set so that their resistance changes may become, respectively, 1/32, 2/32, 4/32, 8/32 and 16/32, when the fuses 21 to 25 are successively cut off. More definitely, assuming that the total resistance value (TR value) of the circuit 100 is set at $R_1$ with the fuses 21 to 25 connected, the TR value becomes $R_1 + \Delta R$ with the fuse 21 cut off, $R_1 + 2^1(=2)\Delta R$ with the fuse 22 cut off, $R_1 + 2^2 \Delta R$ with the fuse 23 cut off, ..., and $R_1 + 2^{5-1}(=2^4)\Delta R$ with the fuse 25 cut off, respectively.

At the same time, assuming that the resistance value of each of the fuses 21 to 25 is $r_f$, the values $\Delta R$ and $r_1$ and $r_5$ can be obtained from the following equations:

$$r_1 \| (r_1' + r_f) + r_2 \| (r_2' + r_f) + r_3 \| (r_3' + r_f) + r_4 \| r_f + r_5 \| r_f = R_1 \quad (1)$$

$$r_1 - r_1 \| (r_1' + r_f) = \Delta R \quad (2)$$

$$r_2 - r_2 \| (r_2' + r_f) = 2\Delta R \quad (3)$$

$$r_3 - r_3 \| (r_3' + r_f) = 4\Delta R \quad (4)$$

$$r_4 - r_4 \| r_f = 8\Delta R \quad (5)$$

$$r_5 - r_5 \| r_f = 16\Delta R \quad (6)$$

where symbol " $\|$ " means that the parallel resistance of its adjacent resistors is calculated $$\left(\text{for instance, } r_4 \| r_f \text{ is equal to } \frac{r_4 \, r_f}{r_4 + r_f}\right).$$

Next, the operation of the shown embodiment will be described in detail, particularly in the case where the output voltage $V_1$ of the power source 10 is slightly larger than a desired voltage $V_0$, to be produced at the terminal 9. The voltage appearing at the terminal 9 is $V_2$ with the fuses 21 to 25 cut off under the condition of $V_1 \geq V_0 \geq V_2$. The voltage $V_1$ at the terminal 9 can be adjusted to become the voltage $V_0$ in a step width of $1/32 \, (V_1 - V_2)$ by the cutting-off control of fuses 21 to 25. For example, the voltage $V_1$ is decreased by $3/32 \, (V_1 - V_2)$ by cutting off the fuses 21 and 22.

The resistor 19, the fuse 26, and the terminal 1 connected to the power source 10 are used to increase the output voltage of the power source 10 by cutting off the fuse 26 when the voltage of the source 10 is lower than the desired voltage $V_0$. The voltage adjusting operation is then performed by suitably cutting off the fuses 21 to 25 as mentioned above, to provide the desired voltage $V_0$.

Thus, the voltage deviation can be adjusted to the desired voltage by the circuit 100.

The use of the polysilicon resistors for both the network 20 and the circuit 100 permits these circuits to be manufactured in one production step, resulting in a reduction of the total manufacturing steps for the present RV generator. The use of the polysilicon resistors also enables a constant reference voltages to be given from network 20 irrespective of ambient temperatures because each of the resistors used in the circuits 20 and 100 has an equal temperature coefficient.

The present generator may be applied to the D/A converter shown in FIG. 3 of Reference 2.

What is claimed is:

1. A reference voltage generator for use in an analog-to-digital or a digital-to-analog converter, said generator comprising:
    a power source means for generating a voltage;
    a voltage adjusting circuit means connected to the power source means, said voltage adjusting circuit means being composed of N (N being a plural number) polysilicon resistors connected serially and N polysilicon fuses connected in parallel to both ends of each of the N resistors to adjust the output voltage of the power source; and
    a resistor network connected to the voltage adjusting circuit and composed of M (M being a plural number) polysilicon resistors for providing (M-1) reference voltages based on the output voltage of the adjusting circuit, the values of said N resistors of the voltage adjusting circuit being such that the total resistance value of the adjusting circuit becomes $R_0 + 2^{l-1} \Delta R$ with the l-th (l being equal to or smaller than N) polysilicon fuse of the adjusting circuit cut off, whereby the total resistance value of the adjusting circuit is $R_0$ with all the polysilicon fuses connected, and the resistance change of the adjusting circuit is $\Delta R$ with the first fuse cut off.

2. A reference voltage generator comprising a voltage source, means in series with a fuse for applying an electrical bias to said voltage source, whereby a total electrical bias acting upon said source may be changed by an elimination of said fuse, said voltage source being connected through a voltage adjusting means to a reference circuit means having a plurality of output terminals, a different voltage potential appearing on each of said terminals, said voltage adjusting means comprising two series of circuit components connected in parallel between said voltage source and said reference circuit means, whereby the potential applied to said reference circuit means is a function of the voltage drop across said two series, each of said series of components further comprising a series of resistors, the first of said series comprising resistors connected directly to each other and the second of said series comprising resistors connected in series with individually associated fuses and cross connected to said first series at the opposite ends of each of said resistors in said first series, said fuses appearing at points in said second series which are in parallel with resistors in said first series which are to be controlled, whereby individual ones of said fuses may be selectively eliminated to fine tune the total voltage drop across said two series, and terminal means connected to opposite ends of each of said fuses for enabling current pulses to be applied across individual ones of said fuses to eliminate that fuse.

* * * * *